(12) United States Patent
Yu

(10) Patent No.: US 6,348,888 B1
(45) Date of Patent: Feb. 19, 2002

(54) PIPELINED ADC WITH NOISE-SHAPED INTERSTAGE GAIN ERROR

(75) Inventor: Paul C. Yu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/273,837

(22) Filed: Mar. 22, 1999

(51) Int. Cl.$^7$ ............................................... H03M 1/38
(52) U.S. Cl. ........................................ 341/161; 341/143
(58) Field of Search ................................ 341/161, 155, 341/143

(56) References Cited

U.S. PATENT DOCUMENTS

| | | | | |
|---|---|---|---|---|
| 4,894,656 A | * | 1/1990 | Hwang et al. ............... | 341/120 |
| 4,965,531 A | * | 10/1990 | Riley .......................... | 331/1 A |
| 5,153,593 A | * | 10/1992 | Walden et al. ............... | 341/143 |
| 5,629,701 A | * | 5/1997 | Ritoniemi et al. ........... | 341/143 |
| 5,936,562 A | * | 8/1999 | Brooks et al. ............... | 341/143 |
| 5,946,402 A | * | 8/1999 | Nishio et al. ................ | 381/103 |
| 5,982,313 A | * | 11/1999 | Brooks et al. ............... | 341/143 |
| 6,075,474 A | * | 6/2000 | Gabet et al. ................. | 341/143 |

* cited by examiner

*Primary Examiner*—Peguy JeanPierre
(74) *Attorney, Agent, or Firm*—J. Dennis Moore; W. James Brady, III; Frederick J. Telecky, Jr.

(57) ABSTRACT

A pipelined analog to digital converter for converting an analog signal to a sequence of digital words, each such word representing a value of the analog signal at a time in a succession of times. The converter includes a sequence of analog to digital converter stages, each such stage generating at least one bit for each such word. A first such stage in the sequence receives the analog signal, and each such stage subsequent to the first stage receives a residue signal from a previous stage in the sequence. Each such stage includes an analog to digital unit that senses a sample of the analog signal and provides one or more bits representing a value of the sample. In at least one of the stages the analog to digital unit comprises a $\Sigma$-$\Delta$ converter.

3 Claims, 2 Drawing Sheets

US 6,348,888 B1

PIPELINED ADC WITH NOISE-SHAPED INTERSTAGE GAIN ERROR

TECHNICAL FIELD OF THE INVENTION

This present invention relates to analog-to-digital converter (hereinafter "ADC") systems and, more particularly, to an apparatus and method for providing a noise-shaped interstage gain error.

BACKGROUND OF THE INVENTION

A conventional multi-bit per stage, pipelined ADC 10 is shown in FIG. 1. Four stages 12, 14, 16, 18 are shown; however, as shown by ellipsis 20, further stages may be included. An analog input signal $V_{IN}$ is provided on line 22 to stage one 12. A first residual signal $V_{RES1}$ is provided on line 24 from stage one 12 to stage two 14. A second residual signal $V_{RES2}$ is provided on line 26 from stage two 14 to stage three 16. A third residual signal $V_{RES3}$ is provided on line 28 from stage three 16 to stage four 18. A further residual signal is provided from stage four 18 on line 30, and so forth.

Typically, all of the stages of a pipelined ADC such as ADC 10 are the same. In FIG. 1, the functional components of stage two 14 are shown by way of example. Thus, referring to the blowup 15 of stage two 14, input line 24 can be seen, which is an input to sample and hold amplifier ("SHA") 32. The output of SHA 32 is provided on line 34 to an m-bit analog-to-digital subconverter (ADSC) 36, which is typically a flash ADC, and to a first input of a summing unit 38. The output of m-bit ADSC 36 is an m-bit sub-word, which is provided on line 40 both as an output to stage two 14 and is provided as an input to m-bit digital-to-analog subconverter (DASC) 42. The output of m-bit DASC 42 is provided on line 44 to a subtracting input to summing unit 38. The output of summing unit 38 is provided on line 46 to a $2^m$ amplifier 48, which has a theoretical gain of $2^m$. The output of $2^m$ amplifier 48 is provided on line 26.

In operation, stage two 14 operates as follows. An analog signal is provided on line 24 to SHA 32. SHA 32 samples the analog signal on line 24 at a succession of times and holds each such sample as a signal level on line 34 for a time sufficient to permit m-bit ADSC 36 to sense the level of the signal on line 34 and provided a digital representation thereof, as a sub-word of m-bits, on line 40. Those m-bits are converted to an analog voltage signal by m-bit DASC 42, and provided on line 44. The analog signal on line 44 is subtracted from the input signal on line 34 by summing unit 38, and the difference signal is provided on line 46 to amplifier 48, where it is amplified by a factor of $2^m$. The difference signal on line 46 represents the negative of the error made by the m-bit ADSC 36. Theoretically, that error signal represents the inaccuracy of the m-bit representation of the analog signal on line 24 due to the limited number of bits. That error signal, amplified by $2^m$, is input to the following stage of the pipeline via line 26, where a similar set of operations is performed.

After the signal propagates through n stages, a digital sample of the input signal $V_{IN}$ is obtained. Each of the sub-word bit lines provided at the output of the respective stage's ADSC, e.g., bit lines 40 from ADSC 36, contributes to the overall digital word which is the digital representation provided by ADC 10 of the sampled signal $V_{IN}$. The sub-word bit lines are concatenated to form this word. A new word is generated for each time period for which a sample is taken in the sample and hold amplifiers, e.g., SHA 32.

In a conventional pipelined ADC, there are three main error sources. The first is the ADSC linearity in the form of comparator offsets. This error can typically be removed by using conventional digital error correction, as described in more detail below. The remaining two error sources are the DASC linearity error and the interstage gain error.

Techniques are known for reducing the DASC linearity error, for example by using a number of dynamic element matching techniques for linearizing the DASC in multiple bit Σ-Δ ADCs. Examples of such techniques are described in L. R. Carley, "Noise Shaping Coder Typology for 15-bit Converters," *IEEE J Solid-State Circuits*, S.C. 24 No. 2, pp. 267–273, Apr. 1989; B. H. Leung and S. Sutarja, "Multibit Σ-Δ Converter Incorporating a Novel Class of Dynamic Element Matching Techniques," *IEEE Trans. Circuits and Syst. II*, Vol. 39, No. 1, pp. 35–51, Jan. 1992; R. T. Baird and T. Fiez, "Improved Σ-Δ DAC Linearity Using Data Weighted Averaging," *Proc. 1995 IEEE Int. Symp. Circuits Sys.*, Vol. 1, pp. 13–16, May 1995; and R. Adams and T. Kuan, "Data-Directed Scrambler for Multi-Bit Noise Shaping D/A Converters," U.S. Pat. No. 5,404,142, Assigned to Analog Devices, Inc., Apr. 4, 1995. By using a time varying combination of elements to represent the given DASC output level, the element mismatch errors are averaged out over time, thereby linearizing the DASC.

The remaining unsolved problem is the interstage gain error. Therefore, it is an object of the invention to provide a solution to the problem of interstage gain error in multi-bit per stage pipelined ADCs. It is also an object of the present invention to provide a pipelined ADC reducing interstage gain error, as compared with prior art ADCs, while maintaining sufficient simplicity in the overall ADC design so as to permit a commercially viable product including such an ADC.

SUMMARY OF THE INVENTION

According to the present invention, there is provided a pipelined analog-to-digital converter for converting an analog signal to a sequence of digital words, each such word representing a value of the analog signal at a time in a succession of times. The converter includes a sequence of analog-to-digital converter stages, each such stage generating at least one bit for each such word. A first such stage in the sequence receives the analog signal, and each such stage subsequent to the first stage receives a residue signal from a previous stage in the sequence. Each such stage includes an analog-to-digital unit that senses a sample of the analog signal and provides one or more bits representing a value of the sample. In at least one of the stages the analog-to-digital unit comprises a Σ-Δ converter.

These and other features of the invention will be apparent to those skilled in the art from the following detailed description of the invention, taken together with the accompanying drawings.

DESCRIPTION OF PREFERRED EMBODIMENTS OF THE PRESENT INVENTION

A new pipelined architecture is disclosed herein. In this architecture, interstage gain error in a pipelined ADC is noise shaped, for example by being pushed to higher frequencies. Once the interstage gain error is pushed to high frequencies, it can be filtered out using techniques similar to those used to filter out high frequency components from a $\Sigma$-$\Delta$ converter.

Figure 1:
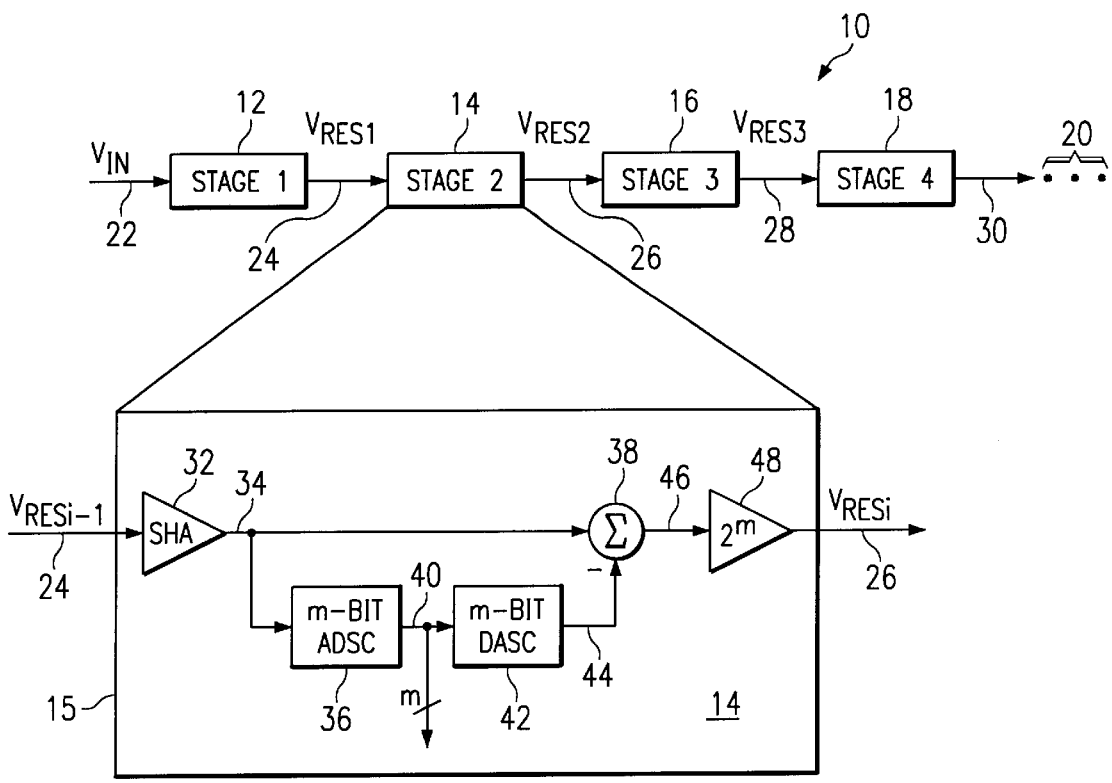
FIG. 1 is a block diagram of a prior art analog-to-digital converter.
Figure 2:
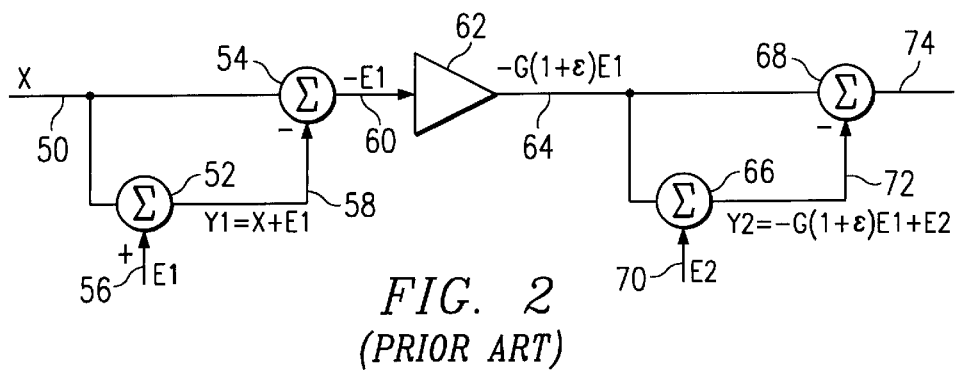
FIG. 2 is a linearized model of two of the stages of the ADC of FIG. 1.

In order to better appreciate the present invention, a more detailed discussion of the ADC shown in FIG. 1 is now presented. FIG. 2 shows a linearized model of two stages in the ADC 10 of FIG. 1. The input X is provided on line 50 to an input of summing unit 52, that represents the ADSC 36 of FIG. 1, and to an input of summing unit 54, that represents summing unit 38 of FIG. 1. Summing unit 52 also "receives" an error signal E1, i.e., the quantization noise introduced by the ADSC 36 of FIG. 1. A signal Y1=X+E1 is provided on line 58 from summing unit 52 to a subtracting input of summing unit 54. A difference signal, -E1, is provided on line 60 from summing unit 54 to an amplifier 62 having an interstage gain of G(1+$\epsilon$). The output signal from amplifier 62 minus G(1+$\epsilon$) E1 is provided on line 64 to an input of summing unit 66 and to an input of summing unit 68. Summing unit 66 receives a second error signal E2 and provides an output signal Y2=G(1+$\epsilon$)E1+E2 on line 72 to the subtracting input of summing unit 68. The output of summing unit 68 is provided on line 74.

The ADSC in the first stage, which is modeled as a summing unit 52, quantizes the input X of FIG. 2, and produces the most significant bits (MSB's) of the pipeline given by Y1. The digital word Y1 consists of the ideal digital representation of the input signal X, plus the error E1 made by the first ADSC. The digital code Y1 is converted back to analog using a DASC, in this case modeled as ideal, and simply represented by line 58. In practice, the DASC can be linearized using the dynamic element matching techniques mentioned above.

The difference between the sampled input X and the output of the DASC is -E1, the negative of the error made by the ADSC. This difference is amplified by an interstage gain of G(1+$\epsilon$) with E being the percentage error. In the ideal case, when $\epsilon$ is 0, the total output is given by:

$$Y12=Y1+(1/G)Y2=(X+E1)+(-E1+E2/G)=X+E2/G \quad (1)$$

From Equation (1) it can be seen in the ideal case that errors made by the first stage ADSC of FIG. 2 are canceled by the second stage while errors made by the second stage ADSC are divided by the interstage gain G. Equation (1) shows that in the case where the DASC and the interstage gain are perfect, offsets in the ADSC can be digitally error corrected. In the general case with many pipelined stages, the final digital output comprises the input X plus the error made by the last stage ADSC, divided by the product of all of the interstage gain that proceeds the last stage of the pipeline.

For the two-stage pipeline in FIG. 2, when there is an interstage gain error, the final digital output is given by:

$$Y12=Y1+(1/G)Y2=(X+E1)+(1+\epsilon)(-E1)+E2/G=X+(E2/G)-\epsilon E1 \quad (2)$$

Thus, the effect of interstage gain error is the imperfect cancellation of E1, the error made by the first stage ADSC. In a high resolution multi-stage pipeline, the $\epsilon$ E1 "leakage" term can be significantly greater than E2/G since the effective G is now the product of all interstage gain that precedes the last stage of the pipeline, and can be quite large. In this case, the interstage gain error is the limiting factor in obtaining high resolution.

Figure 3:
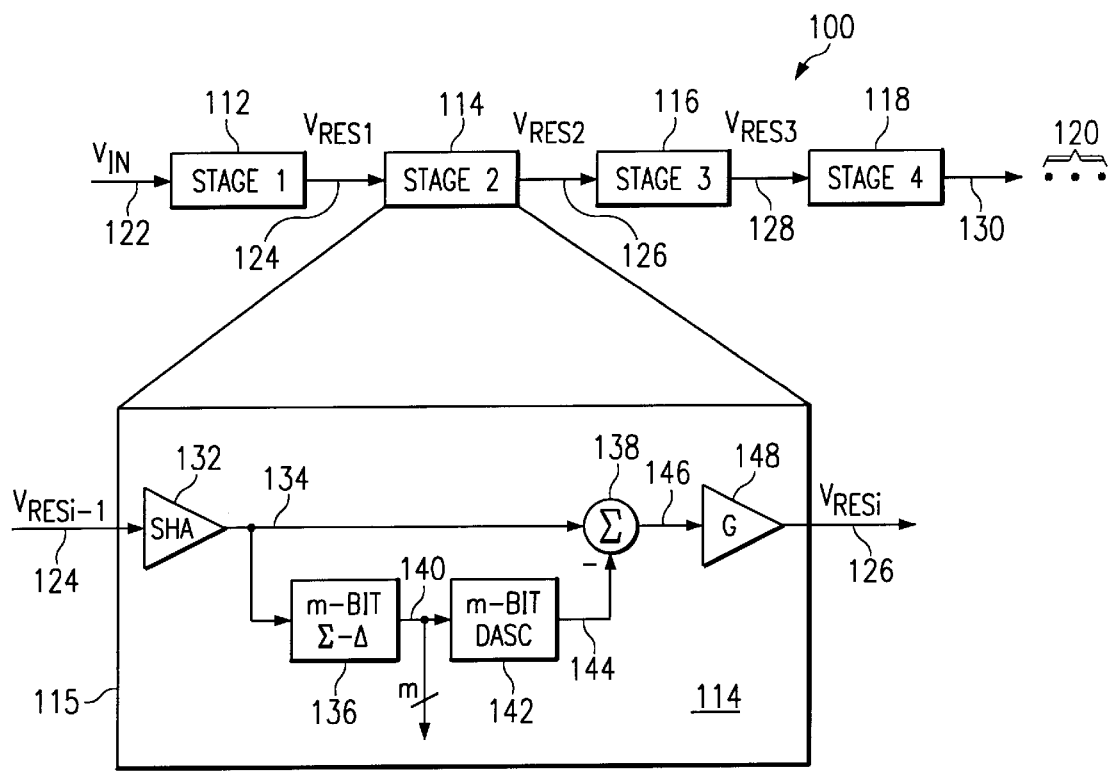
FIG. 3 is a block diagram of an improved ADC incorporating an embodiment of the present invention.

The preferred embodiment of the present invention, in which the interstage gain error is greatly reduced as compared with the prior art is shown in FIG. 3. The ADC 100 shown in FIG. 3 is similar in some respects to the ADC 10 of FIG. 1. Thus, ADC 100 (FIG. 3) is made of a plurality of stages, e.g., stage one 112, stage two 114, stage three 116, and stage four 118, with other stages being possible as shown by ellipsis 120. As in ADC 10 of FIG. 1, an input analog signal VIN is provided on line 122 to stage one 112. A first residue signal is provided from stage one 112 on line 124 to stage two 114. A second residue signal is provided on line 126 from stage two 114 to stage three 116. A third residue signal is provided on line 128 from stage three 116 to stage four 118, and so forth.

Stage two 114, however, is different from stage two 14 of FIG. 1. Thus, referring to the blowup 115 of stage two 114, there is shown an SHA 132 providing an output signal on line 134 to summing unit 138. However, instead of having a conventional prior art flash ADC, such as ADC 36 as in FIG. 1, in the preferred embodiment of the present invention an m-bit $\Sigma$-$\Delta$ converter 136 is provided that receives line 134 as an input. The output of m-bit $\Sigma$-$\Delta$ converter 136 is an m-bit sub-word, which is provided on line 140 both as an output to stage two 114 and is provided as an input to m-bit DASC 142. The output of m-bit DASC 142 is provided on line 144 to a subtracting input to summing unit 138. The output of summing unit 138 is provided on line 146 to an amplifier 148. The gain G of amplifier 148 is preferably chosen to be as large as possible to reduce the next stage's error (see the term E2/G in Equation (2)), but not so large that it overloads the next stage in the pipeline. The output of amplifier 148 is provided on line 126. The effect of the m-bit $\Sigma$-$\Delta$ converter 136 is both to generate the m-bits contributed by the respective stage, and also to move the interstage gain error into other frequency bands, outside of the band of interest, where their effect on the function of the overall circuit is diminished, and the noise may be attenuated by appropriate methods, for example by filtering. In most applications the interstage gain error will simply be pushed to higher frequencies, but the $\Sigma$-$\Delta$ converter can be constructed, according to known techniques, to push the error to lower frequencies, or even to an intermediate band.

Figure 4:
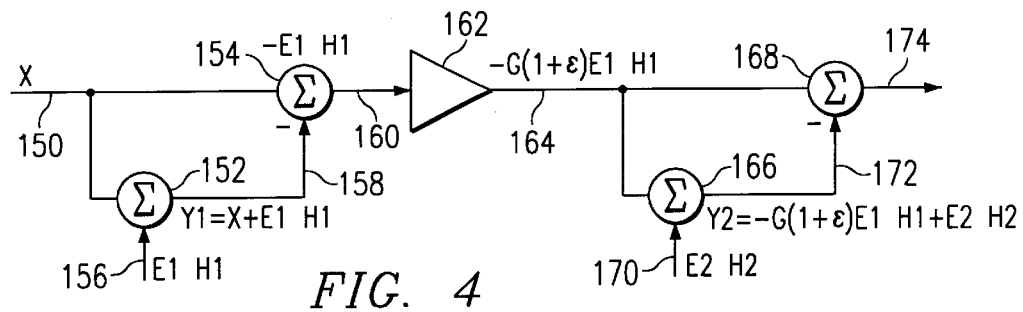
FIG. 4 is a linearized model of two stages of the ADC of FIG. 3.

The effect on interstage gain error of the addition of the m-bit $\Sigma$-$\Delta$ converter 136 of FIG. 3 may by clearly seen by reference to FIG. 4, which is a linearized model of the pipelined ADC 100 of FIG. 3. A signal X is provided on line 150 to an input of a summing unit 152, that represents the ADSC 136 of FIG. 3, and to an input of summing unit 154, that represents summing unit 138 of FIG. 3. Summing unit 152 receives at another input the factor E1 H1 and provides an output Y1=X+E1 H1 on line 158 to a subtracting input of summing unit 154. The output of summing unit 154, -E1 H1, is provided on line 160 to an amplifier 162 having a gain of -G(1+$\epsilon$). The output of amplifier 162, -G(1+$\epsilon$) E1 H1, is provided on line 164 to an input of summing unit 166 and to an input of summing unit 168. Summing unit 166 receives on line 170 another input, E2 H2. The output of summing unit 166 Y2=-G(1+$\epsilon$)E1 H1+E2 H2 is provided on line 172 to a subtracting input of summing unit 168. The output of summing unit 168 is provided on line 174. For this new architecture the total digital output is given by:

$$Y12=Y1+Y2/G=(X+E1\ H1)+(1+\epsilon)(-E1\ H1)+E2\ H2/G=X+(E2\ H2/G)-\epsilon E1\ H1 \quad (3)$$

The last term in equation 3 shows that the leakage $\epsilon$ E1 due to the interstage gain error is now noise shaped by the noise-shaping function H1.

When a simple, first order $\Sigma$-$\Delta$ ADC is used for the m-bit $\Sigma$-$\Delta$ converter 136 (FIG. 3), a noise shaping function H1 and H2 is given by $(1-Z^{-1})$, the first difference. In principle, higher order noise-shaping function can be used to noise shape the gain error to the $n^{th}$ order at the cost of extra complexity and hardware.

At a low over-sampling ratio, when a $\Sigma\text{-}\Delta$ converter is used to implement the ADSC, the delay associated with the input can overload the next stage. In such a case, a corresponding delay in the signal path of line 134 (FIG. 3) can be used to avoid this problem.

Although the present invention and its advantages have been described in detail, it should be understood that various changes, substitutions and alterations can be made herein without departing from the spirit and scope of the invention as defined by the appended claims. For example, although the specific embodiments described herein are with respect to a multi-stage pipelined ADC, the inventive techniques may be applied as well to cyclic, or re-cycling ADCs, in which one or more stages may be reused by having an intermediate output re-applied to the input of a stage.

What is claimed is:

1. A pipelined analog to digital converter for converting an analog signal to a sequence of digital words, each such word representing a value of said analog signal at a time in a succession of times, comprising:

a sequence of analog to digital converter stages, each such stage generating at least one bit for each such word, a first such stage in said sequence receiving said analog signal, and each such stage subsequent to said first stage receiving a residue signal from a previous stage in said sequence, each such stage including an analog to digital unit that senses a sample of said analog signal or of said residue signal, as the case may be, and provides one or more bits representing a value of said sample, wherein, in at least one of said stages, said analog to digital unit comprises a $\Sigma\text{-}\Delta$ converter.

2. A pipelined analog to digital converter for converting a first analog signal to a sequence of digital words, each such word representing a value of said first analog signal at a time in a succession of times, comprising:

a sequence of analog to digital converter stages, each such stage generating at least one bit for each such word, a first such stage in said sequence receiving said first analog signal, and each such stage subsequent to said first stage receiving a residue signal from a previous stage in said sequence, each such stage comprising a sample and hold unit, that provides a sample of said first analog signal or of said residue signal, as the case may be, during each time in said succession of times and holds said sample for sensing, an analog to digital unit that senses said sample and provides one or more bits representing a value of said sample, a digital to analog unit receiving said one or more bits that generates a second analog signal corresponding to said one or more bits, and a residue unit responsive to said sample and to said second analog signal that provides a residue signal corresponding to the difference between said sample and said second analog signal;

wherein, in at least one of said stages, said analog to digital unit comprises a $\Sigma\text{-}\Delta$ converter.

3. A pipelined analog to digital converter according to claim 1, wherein each analog to digital converter stage further comprises:

a sample and hold amplifier for sensing said sample;

a digital to analog subconverter receiving the output of said analog to digital subconverter for such stage and providing an output;

a subtraction unit for subtracting the output of said digital to analog subconverter from the sensed sample and providing an output; and an amplifier for amplifying the output of said subtraction unit.

* * * * *